US012686734B2

(12) United States Patent

Kodani et al.

(10) Patent No.: US 12,686,734 B2
(45) Date of Patent: Jul. 21, 2026

(54) FLUORINE-CONTAINING POLYMER FILM

(71) Applicant: DAIKIN INDUSTRIES, LTD., Osaka (JP)

(72) Inventors: Tetsuhiro Kodani, Osaka (JP); Saori Sakami, Osaka (JP); Shinya Bitou, Osaka (JP); Masaharu Arimoto, Osaka (JP); Takashi Kanemura, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 804 days.

(21) Appl. No.: 17/969,953

(22) Filed: Oct. 20, 2022

(65) Prior Publication Data

US 2023/0069063 A1 Mar. 2, 2023

Related U.S. Application Data

(63) Continuation of application No. PCT/JP2021/015131, filed on Apr. 12, 2021.

(30) Foreign Application Priority Data

Apr. 22, 2020 (JP) ................................ 2020-076303

(51) Int. Cl.

| | |
|---|---|
| ***C08F 214/22*** | (2006.01) |
| ***C08F 214/24*** | (2006.01) |
| ***C08F 214/26*** | (2006.01) |
| ***C08J 5/18*** | (2006.01) |

(Continued)

(52) U.S. Cl.

CPC .......... *C08F 214/22* (2013.01); *C08F 214/24* (2013.01); *C08F 214/26* (2013.01); *C08J 5/18* (2013.01); *H10N 30/045* (2023.02); *H10N 30/098* (2023.02)

(58) Field of Classification Search

None

See application file for complete search history.

(56) References Cited

U.S. PATENT DOCUMENTS 4,656,234 A * 4/1987 Murayama ............. H01B 3/445 264/564
2010/0068460 A1 3/2010 Moriyama et al.
2013/0122275 A1 5/2013 Moriyama et al.

(Continued)

FOREIGN PATENT DOCUMENTS

EP 3 869 576 8/2021
JP 2008-171935 7/2008

(Continued)

OTHER PUBLICATIONS

JP-2011018682-A, 2011, machine translation (Year: 2011).*

(Continued)

*Primary Examiner* — Satya B Sastri

(74) *Attorney, Agent, or Firm* — Wenderoth, Lind & Ponack, L.L.P.

(57) ABSTRACT

An object is to provide a fluorine-containing polymer film. The object can be achieved by a fluorine-containing polymer film having a thermal shrinkage of 0.4% or less after being heated at 90° C. for 1 hour, and having a relative permittivity of 3 to 50 at 25° C. at 1000 Hz, or a fluorine-containing polymer film having a crystallinity of 50% or more and an elongation at break of 400% or more.

9 Claims, 1 Drawing Sheet

(51) Int. Cl.
*H10N 30/045* (2023.01)
*H10N 30/098* (2023.01)

(56) References Cited

U.S. PATENT DOCUMENTS

| | | | |
|---|---|---|---|
| 2017/0355870 A1 | 12/2017 | Domingues Dos Santos et al. | |
| 2021/0384411 A1* | 12/2021 | Kodani | H10N 30/857 |

FOREIGN PATENT DOCUMENTS

| | | | | | |
|---|---|---|---|---|---|
| JP | 2011-18682 | | | 1/2011 | |
| JP | 2011018682 | A | * | 1/2011 | |
| JP | WO 2015/053346 | | | 4/2015 | |
| JP | 2016-219804 | | | 12/2016 | |
| JP | 2016219804 | A | * | 12/2016 | |
| JP | 2018-505273 | | | 2/2018 | |
| JP | 2019-2003 | | | 1/2019 | |
| JP | 2019-67908 | | | 4/2019 | |
| JP | 2019067808 | A | * | 4/2019 | C09K 11/7734 |
| JP | 2019-172787 | | | 10/2019 | |
| WO | WO-2015064328 | A1 | * | 5/2015 | H10N 30/857 |
| WO | 2020/080382 | | | 4/2020 | |
| WO | WO-2020080382 | A1 | * | 4/2020 | H04R 17/00 |

OTHER PUBLICATIONS

JP 2019067808 A, 2019, machine translation (Year: 2019).*

WO 2015064328 A1, machine translation, (Year: 2015).*

JP2016219804A, machine translation, 2016 (Year: 2016).*

International Search Report issued Jul. 6, 2021 in International (PCT) Application No. PCT/JP2021/015131.

Extended European Search Report issued Apr. 17, 2024 in corresponding European Patent Application No. 21791750.9.

International Preliminary Report on Patentability issued Oct. 25, 2022 in corresponding International (PCT) Patent Application No. PCT/JP2021/015131.

* cited by examiner

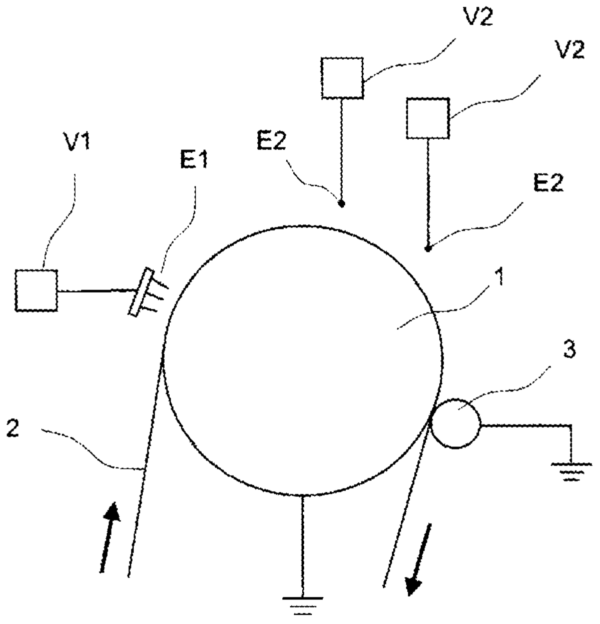
V2
V2
V1
E1
E2
E2
1
3
2

FLUORINE-CONTAINING POLYMER FILM

TECHNICAL FIELD

The present disclosure relates to a fluorine-containing polymer film with a low thermal shrinkage and a fluorine-containing polymer film with a high crystallinity and a high elongation at break.

BACKGROUND ART

Piezoelectric films have piezoelectricity (the property of converting applied force into voltage, or the property of converting applied voltage into force). Piezoelectric films have various applications in which piezoelectricity is used (e.g., sensors, actuators, touch panels, haptic devices (devices that have the ability to feed back tactile sensations to users), vibration power generators, speakers, and microphones).

Polyvinylidene fluoride (PVDF) films are typically used as piezoelectric films. In order to impart good piezoelectricity to a PVDF film, it is necessary to uniaxially stretch the PVDF film and apply polarization treatment (e.g., PTL 1).

CITATION LIST

Patent Literature

PTL 1: JP2008-171935A

SUMMARY

The present disclosure includes the following embodiments.

(A) A fluorine-containing polymer film having a thermal shrinkage of 0.4% or less after being heated at 90° C. for 1 hour, and having a relative permittivity of 3 to 50 at 25° C. at 1000 Hz.

(B) A piezoelectric film comprising a fluorine-containing polymer film, wherein the fluorine-containing polymer film satisfies the following (1) and (2):

(1) the fluorine-containing polymer film has a crystallinity of 50% or more, the crystallinity being expressed by 100×(area of crystalline peak)/(sum of area of crystalline peak and area of amorphous halo peak) wherein in an X-ray diffraction pattern obtained by placing a film sample directly on a sample holder with an aperture, and performing X-ray diffraction measurement at a diffraction angle 2θ of 10 to 40°, a baseline is set as a straight line connecting a diffraction intensity at a diffraction angle 2θ of 10° and a diffraction intensity at a diffraction angle 2θ of 25°, an area surrounded by the baseline and a diffraction intensity curve is separated into two symmetric peaks by profile fitting, and of these peaks, a peak with a larger diffraction angle 28 is recognized as the crystalline peak, and a peak with a smaller diffraction angle 28 is recognized as the amorphous halo peak; and (2) the fluorine-containing polymer film has an elongation at break of 400% or more.

The present disclosure provides a fluorine-containing polymer film with a low thermal shrinkage and a fluorine-containing polymer film with a high crystallinity and a high elongation at break.

BRIEF DESCRIPTION OF DRAWINGS

FIG. 1 is a diagram showing an outline of a production device used in the production of piezoelectric films in Examples.

DESCRIPTION OF EMBODIMENTS

The summary of the present disclosure above is not intended to describe each of the disclosed embodiments or all implementations of the present disclosure.

The following description of the present disclosure more specifically describes example embodiments.

Guidance is provided through examples in several parts of the present disclosure, and these examples can be used in various combinations.

In each case, the group of examples can function as a non-exclusive and representative group.

All publications, patents, and patent applications cited in this specification are incorporated herein by reference in their entirety.

Terms

Unless otherwise specified, the symbols and abbreviations in the present specification can be understood in the context of the present specification in the meaning commonly used in the technical field to which the present disclosure pertains.

In the present specification, the terms "comprise" and "contain" are used with the intention of including the terms "consisting essentially of" and "consisting of."

Unless otherwise specified, the steps, treatments, or operations described in the present specification can be performed at room temperature.

In the present specification, "room temperature" refers to a temperature within the range of 10 to 40° C.

In the present specification, the phrase "$C_{n-m}$" (n and m are each a number) indicates that the number of carbon atoms is n or more and m or less, as can be generally understood by a person skilled in the art.

Fluorine-Containing Polymer Film

The fluorine-containing polymer film according to the present disclosure contains a fluorine-containing polymer.

The fluorine-containing polymer contain at least a fluorine-containing monomer unit. Specific examples of fluorine-containing monomers include vinyl fluoride (VF), vinylidene fluoride (VDF), trifluoroethylene (TrFE), tetrafluoroethylene (TFE), hexafluoropropene (HFP), 1-chloro-1-fluoroethylene (1,1-CFE), 1-chloro-2-fluoroethylene (1,2-CFE), 1-chloro-2,2-difluoroethylene (CDFE), chlorotrifluoroethylene (CTFE), trifluorovinyl monomers, 1,1,2-trifluorobutene-4-bromo-1-butene, 1,1,2-trifluorobutene-4-silane-1-butene, perfluoropropyl vinyl ether (PPVE), perfluoroacrylate, 2,2,2-trifluoroethyl acrylate, 2-(perfluorohexyl)ethyl acrylate), and combinations of two or more of these. Preferable examples of fluorine-containing monomers include vinyl fluoride, vinylidene fluoride, trifluoroethylene, tetrafluoroethylene, and combinations of two or more of these.

The fluorine-containing polymer may further contain a fluorine-free monomer unit. Specific examples of fluorine-free monomers include α-olefins (e.g., ethylene, propylene); unsaturated dicarboxylic acid, and derivatives thereof (e.g., maleic acid, and maleic anhydride); vinyl ethers (e.g., ethyl vinyl ether); allyl ethers (e.g., allyl glycidyl ether); vinyl esters (e.g., vinyl acetate); acrylic acid, and esters thereof; methacrylic acid, and esters thereof; and combinations of two or more of these.

The proportion of the fluorine-containing monomer unit to all of the monomer units of the fluorine-containing polymer can be, for example, 50 mol' or more, 60 mol % or more, 70 mol % or more, 80 mol % or more, or 90 mol % or more. The proportion of the fluorine-containing monomer unit can also be, for example, 99 mol % or less, or 95 mol % or less.

The fluorine-containing polymer can preferably be a vinylidene fluoride-based polymer. The vinylidene fluoride-based polymer contains at least a vinylidene fluoride unit ($—CH_2—CF_2—$). The vinylidene fluoride-based polymer may further contain at least one additional monomer unit selected from the group consisting of a fluorine-containing monomer unit other than vinylidene fluoride and a fluorine-free monomer unit.

Preferable examples of fluorine-containing monomers other than vinylidene fluoride include trifluoroethylene, tetrafluoroethylene, and combinations of these.

The proportion of the vinylidene fluoride unit to all of the monomer units of the vinylidene fluoride-based polymer can be, for example, 10 mol % or more, 15 mol % or more, 20 mol % or more, 25 mol % or more, 30 mol % or more, 35 mol % or more, 40 mol % or more, 45 mol % or more, 50 mol % or more, 55 mol % or more, 60 mol % or more, 65 mol % or more, 70 mol % or more, or 75 mol % or more. The proportion of the vinylidene fluoride unit can be, for example, 99 mol % or less, 95 mol % or less, 90 mol % or less, 85 mol % or less, 80 mol % or less, 75 mol % or less, 70 mol % or less, or 65 mol % or less.

The vinylidene fluoride-based polymer is preferably a vinylidene fluoride-tetrafluoroethylene copolymer or a vinylidene fluoride-trifluoroethylene copolymer.

Although the molar ratio of the vinylidene fluoride unit ($—CH_2—CF_2—$) to the tetrafluoroethylene unit ($—CF_2—CF_2—$) in the vinylidene fluoride-tetrafluoroethylene copolymer is not limited, the ratio can be, for example, within the range of 10/90 to 99/1. The molar ratio is within the range of preferably 60/40 to 97/3, more preferably 65/35 to 95/5, and particularly preferably 70/30 to 90/10.

Although the molar ratio of the vinylidene fluoride unit ($—CH_2—CF_2—$) to the trifluoroethylene unit ($—CF_2—CHF—$) in the vinylidene fluoride-trifluoroethylene copolymer is not limited, the ratio can be, for example, within the range of 40/60 to 99/1. The molar ratio is within the range of preferably 50/50 to 97/3, more preferably 60/40 to 95/5, and particularly preferably 70/30 to 90/10.

The molar ratio of the repeating unit derived from tetrafluoroethylene to the repeating unit derived from vinylidene fluoride in the vinylidene fluoride-tetrafluoroethylene copolymer is within the range of preferably 5/95 to 90/10, more preferably 5/95 to 75/25, still more preferably 15/85 to 75/25, and yet more preferably 36/64 to 75/25.

A copolymer that contains a large amount of vinylidene fluoride is preferred for its superior solvent solubility and excellent film processability.

The molar ratio of the repeating unit derived from tetrafluoroethylene to the repeating unit derived from vinylidene fluoride in the vinylidene fluoride-tetrafluoroethylene copolymer is within the range of preferably 5/95 to 37/63, more preferably 10/90 to 30/70, and still more preferably 5/85 to 25/75.

A copolymer that contains a larger amount of tetrafluoroethylene is preferable for excellent heat resistance of the resulting film.

The molar ratio of the repeating unit derived from tetrafluoroethylene to the repeating unit derived from vinylidene fluoride in the vinylidene fluoride-tetrafluoroethylene copolymer is within the range of preferably 60/40 to 10/90, more preferably 50/50 to 25/75, and still more preferably 45/55 to 30/70.

The vinylidene fluoride-tetrafluoroethylene copolymer may consist of vinylidene fluoride and tetrafluoroethylene, or consist essentially of vinylidene fluoride and tetrafluoroethylene.

The vinylidene fluoride-trifluoroethylene copolymer may consist of vinylidene fluoride and trifluoroethylene, or consist essentially of vinylidene fluoride and trifluoroethylene.

The vinylidene fluoride-tetrafluoroethylene copolymer may further contain at least one additional monomer unit selected from the group consisting of a fluorine-containing monomer unit other than vinylidene fluoride and tetrafluoroethylene, and a fluorine-free monomer unit. The vinylidene fluoride-tetrafluoroethylene copolymer may contain the additional monomer unit in an amount of, for example, 10 mol % or less, preferably 0.01 to 5 mol % of all of the monomer units.

The vinylidene fluoride-trifluoroethylene copolymer may further contain at least one additional monomer unit selected from the group consisting of a fluorine-containing monomer unit other than vinylidene fluoride and trifluoroethylene, and a fluorine-free monomer unit. The vinylidene fluoride-trifluoroethylene copolymer may contain the additional monomer unit in an amount of, for example, 10 mol % or less, preferably 0.01 to 5 mol % of all of the monomer units.

The fluorine-containing polymer is preferably a polarized fluorine-containing polymer. In the present specification, the term "polarization" means that a surface is charged. That is, a polarized fluorine-containing polymer can be an electret or a piezoelectric, or a ferroelectric.

The fluorine-containing polymer film may further contain a polymer other than the fluorine-containing polymer. Specific examples of such polymers include polycarbonate, polyester (e.g., polyethylene terephthalate, and polyethylene naphthalate), polyamide, silicone resin, polyether, polyvinyl acetate, polylactic acid, acrylic resin, methacrylic resin, and polyolefin (e.g., polyethylene, and polypropylene). The polymer may be a polymer other than acrylic resin and methacrylic resin, a polymer other than polyester, or a polymer other than acrylic resin, methacrylic resin, and polyester. The proportion of the polymer other than the fluorine-containing polymer to all of the polymers contained in the fluorine-containing polymer film can be, for example, less than 50% by mass, 45% by mass or less, 40% by mass or less, 35% by mass or less, 30% by mass or less, 25% by mass or less, 20% by mass or less, 15% by mass or less, or 10% by mass or less. The proportion of the polymer other than the fluorine-containing polymer can be, for example, 0% by mass, 0.5% by mass or more, or 1% by mass or more.

The fluorine-containing polymer film may contain commonly used additives. Specific examples of additives include fillers (e.g., inorganic oxide particles), affinity improvers, heat stabilizers, UV absorbers, and pigments; the fluorine-containing polymer film may contain one or a combination of two or more of these. Preferable examples include inorganic oxide particles, and combinations of inorganic oxide particles and affinity improvers.

Preferable examples of inorganic oxide particles include at least one member selected from the group consisting of inorganic oxide particles (B1) to (B3) described below.

Inorganic oxide particles (B1): Particles of oxides of metal elements of Group 2, 3, 4, 12, or 13 of the periodic table, and inorganic-oxide composite particles thereof.

Examples of the metal elements include Be, Mg, Ca, Sr, Ba, Y, Ti, Zr, Zn, and Al.

Preferable examples of (B1) include particles of oxides of Be, Al, Mg, Y, or Zr. These particles are preferable because they are versatile and inexpensive, and have high volume resistivity.

More preferable examples of (B1) include particles of at least one inorganic oxide selected from the group consisting of $Al_2O_3$, MgO, $ZrO_2$, $Y_2O_3$, BeO, and $MgO{\cdot}Al_2O_3$. These particles are preferable because they have high volume resistivity.

Even more preferable examples of (B1) include $Al_2O_3$ having a γ-type crystalline structure. These particles are preferable because they have a large specific surface area and good dispersibility in fluorine-containing polymers.

Inorganic oxide particles (B2): Particles of inorganic composite oxides represented by formula: $M^1_{a1}M^2_{b1}O_{c1}$ wherein M1 is a Group 2 metal element, $M^2$ is a Group 4 metal element, a1 is within the range of 0.9 to 1.1, b1 is within the range of 0.9 to 1.1, c1 is within the range of 2.8 to 3.2, and $M^1$ and $M^2$ each can be one or two or more metal elements.

Preferable examples of the Group 2 metal element include Mg, Ca, Sr, and Ba.

Preferable examples of the Group 4 metal element include Ti and Zr.

Preferable examples of (B2) include particles of at least one inorganic oxide selected from the group consisting of $BaTiO_3$, $SrTiO_3$, $CaTiO_3$, $MgTiO_3$, $BaZrO_3$, $SrZrO_3$, $CaZrO_3$, and $MgZrO_3$. These particles are preferable because they have high volume resistivity.

Inorganic oxide particles (B3): Particles of oxides of metal elements of Group 2, 3, 4, 12, or 13 of the periodic table, and inorganic-oxide composite particles of silicon oxide.

Examples of the metal elements include Be, Mg, Ca, Sr, Ba, Y, Ti, Zr, Zn, and Al.

Specific examples of (B3) include particles of at least one inorganic oxide selected from the group consisting of $3Al_2O_3O{\cdot}2SiO_2$, $2MgO{\cdot}SiO_2$, $ZrO_2{\cdot}SiO_2$, and $MgO{\cdot}SiO_2$.

The inorganic oxide particles are not necessarily required to be highly dielectric, and can be appropriately selected according to the use of the fluorine-containing polymer film. For example, versatile and inexpensive inorganic oxide particles (e.g., (B1), particularly $Al_2O_3$ particles and MgO particles) can be used to improve the volume resistivity. The relative permittivity (1 kHz, 25° C.) of a single type of these inorganic oxide particles (B1) is generally less than 100, and preferably within the range of 10 or less.

As the inorganic oxide particles, inorganic oxide particles (e.g., (B2) and (B3)) with ferroelectricity (e.g., a relative permittivity (1 kHz, 25° C.) of 100 or more) may be used for the purpose of improving permittivity. Inorganic materials that form ferroelectric inorganic oxide particles include, but are not limited to, composite metal oxides, their complexes, solid solutions, and sol-gel forms.

The relative permittivity (25° C., 1 kHz) of the inorganic oxide particles is preferably within the range of 10 or more. From the standpoint of increasing the permittivity of the fluorine-containing polymer film, the relative permittivity is preferably within the range of 100 or more, and more preferably 300 or more. The upper limit of the relative permittivity is not limited, and is generally about 3000.

The relative permittivity (ε) (25° C., 1 kHz) of the inorganic oxide particles is a value calculated from the capacitance (C) measured using an LCR meter, electrode area (5), and sintered body thickness (d) using the formula $C=\varepsilon\varepsilon\times S/d$ ($\varepsilon_0$: permittivity in a vacuum).

The average primary particle size of the inorganic oxide particles is preferably small, and so-called nanoparticles having an average primary particle size of 1 μm or less are particularly preferable. Because such inorganic oxide nanoparticles are uniformly dispersed, the electrical insulating properties of the fluorine-containing polymer film can be significantly improved by incorporating a small amount of the inorganic oxide nanoparticles. The average primary particle size is preferably within the range of 800 nm or less, more preferably 500 nm or less, and even more preferably 300 nm or less. The average primary particle size is preferably within the range of 10 nm or more, more preferably 20 nm or more, and even more preferably 50 nm or more, from the standpoint of difficulty in production, difficulty in uniform dispersion, and cost.

The average primary particle size of the inorganic oxide particles is calculated with a laser diffraction-scattering particle size distribution measuring device (trade name: LA-920, HORIBA, Ltd.) or a similar instrument.

The fluorine-containing polymer film preferably contains the inorganic oxide particles in an amount within the range of 0.01 to 300 parts by mass, and more preferably 0.1 to 100 parts by mass, per 100 parts by mass of the fluorine-containing polymer.

The lower limit of the content of the inorganic oxide particles is preferably 0.1 parts by mass, more preferably 0.5 parts by mass, and even more preferably 1 part by mass, from the standpoint of improving the electrical insulation properties.

The upper limit of the content of the inorganic oxide particles is preferably 200 parts by mass, more preferably 150 parts by mass, and even more preferably 100 parts by mass, from the standpoint of uniformly dispersing the inorganic oxide particles in the fluorine-containing polymer and preventing a decrease in the electrical insulation properties (withstand voltage) and a decrease in the tensile strength of the film.

When high total light transmittance and a low total haze value are required for the fluorine-containing polymer film, the content of the inorganic oxide particles is preferably lower, and more preferably zero.

When the fluorine-containing polymer film contains inorganic oxide particles, the fluorine-containing polymer film may further contain an affinity improver.

The affinity improver can increase the affinity between the inorganic oxide particles and the fluorine-containing polymer, uniformly disperse the inorganic oxide particles in the fluorine-containing polymer, firmly bond the inorganic oxide particles and the fluorine-containing polymer, decrease the formation of voids, and increase the relative permittivity.

Specific examples of affinity improvers include coupling agents, surfactants, and epoxy group-containing compounds.

Examples of coupling agents include organic titanium compounds, organic silane compounds, organic zirconium compounds, organic aluminum compounds, and organic phosphorus compounds.

Examples of organic titanium compounds include organic titanium coupling agents (e.g., alkoxy titanium, titanium chelate, and titanium acylate). Specific examples include tetraisopropyl titanate, titanium isopropoxyoctylene glycolate, diisopropoxy-bis(acetylacetonato)titanium, diisopropoxytitanium diisostearate, tetraisopropylbis(dioctylphosphite)titanate, isopropyltri(n-aminoethyl-aminoethyl)titanate, and tetra(2,2-diallyloxymethyl-1-butyl) bis(di-tridecyl)phosphite titanate.

Preferable examples of organic titanium compounds include alkoxy titanium and titanium chelate because of their good affinity with inorganic oxide particles.

The organic silane compound may be of a high-molecular-weight type or a low-molecular-weight type. Examples include alkoxysilanes (e.g., monoalkoxysilane, dialkoxysilane, trialkoxysilane, and tetraalkoxysilane), vinylsilanes, epoxysilanes, aminosilanes, methacryloxysilanes, and mercaptosilanes. When an alkoxysilane is used, hydrolysis can further improve the volume resistivity (i.e., improve the electrical insulation properties), which is the effect of surface treatment.

Examples of organic zirconium compounds include alkoxyzirconium and zirconium chelate.

Examples of organic aluminum compounds include alkoxyaluminum and aluminum chelate.

Examples of organic phosphorus compounds include phosphite esters, phosphate esters, and phosphate chelates.

The surfactant as the affinity improver may be of a high-molecular-weight type or a low-molecular-weight type, but is preferably of a high-molecular-weight type, from the standpoint of thermal stability.

Examples of surfactants include nonionic surfactants, anionic surfactants, and cationic surfactants.

Examples of nonionic surfactants include polyether derivatives, polyvinylpyrrolidone derivatives, and alcohol derivatives. Preferable examples include polyether derivatives because of their good affinity with inorganic oxide particles.

Examples of anionic surfactants include polymers containing sulfonic acid, carboxylic acid, or a salt thereof. Preferable examples include acrylic acid derivative polymers and methacrylic acid derivative polymers because of their good affinity with fluorine-containing polymers.

Examples of cationic surfactants include amine compounds, compounds having a nitrogen-containing complex ring (e.g., imidazoline), and halogenated salts thereof.

The epoxy group-containing compound as the affinity improver may be a low-molecular-weight compound or a high-molecular-weight compound. Specific examples include epoxy compounds and glycidyl compounds, and preferable examples include low-molecular-weight compounds having one epoxy group, from the standpoint of affinity with fluorine-containing polymers.

More preferable examples of epoxy group-containing compounds include the compound represented by the following formula:

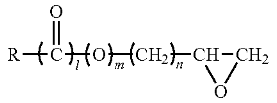

wherein R is a hydrogen atom, a methyl group, a $C_{2-10}$ hydrocarbon group optionally having an intervening oxygen atom or a nitrogen atom, or an optionally substituted aromatic ring group; 1 is 0 or 1; m is 0 or 1; and n is an integer of 0 to 10.

Examples of the compound represented by the above formula include compounds having a ketone group or an ester group, and more specifically the compounds represented by the following formulas:

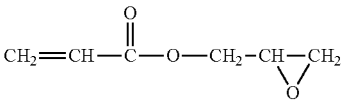

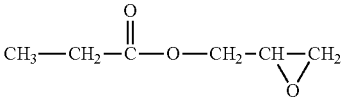

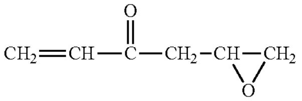

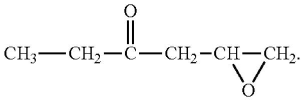

The content of the affinity improver can be preferably within the range of 0.01 to 30 parts by mass, more preferably 0.1 to 25 parts by mass, and even more preferably 1 to 20 parts by mass, per 100 parts by mass of the inorganic oxide particles, from the standpoint of uniform dispersion and high relative permittivity of the resulting fluorine-containing polymer film.

The fluorine-containing polymer film can be a stretched or unstretched film, and is preferably an unstretched film. The fluorine-containing polymer film is preferably a cast film.

Thermal Shrinkage

The "thermal shrinkage" refers to the thermal shrinkage in the direction of maximum contraction in the film plane.

Method for Determining Thermal Shrinkage

Arbitrary two points are marked on a sample film with an inkjet printer, and the distance between the two points is measured before and after heating with an Olympus STM6 optical microscope or its equivalent. Heating is performed by placing the film in a heating oven (ETTAS ONW-3005 constant-temperature dryer or its equivalent) at 90° C. for 1 hour. The thermal shrinkage is determined according to the following formula:

Thermal shrinkage (%)=((distance between two points before heating)−(distance between two points after heating))/(distance between two points before heating)×100

The two arbitrary points are marked 10 cm apart.

The upper limit of the thermal shrinkage of the fluorine-containing polymer film can be preferably 0.4%, 0.35%, 0.3%, 0.25%, 0.2%, 0.15%, 0.1%, 0.07%, 0.05%, 0.03%, 0.01%, or 0%.

The lower limit of the thermal shrinkage of the fluorine-containing polymer film can be preferably −0.4%, −0.35%, −0.3%, −0.25%, −0.2%, −0.15%, −0.1%, −0.07%, −0.05%, −0.03%, −0.01%, or 0%.

The thermal shrinkage is preferably 0.4% or less, within the range of −0.3 to 0.3%, −0.2 to 0.25%, or −0.1 to 0.2%.

Because of its low thermal shrinkage as described above, the fluorine-containing polymer film can be suitably used in areas in which shrinkage due to heat can be problematic. Specific examples of such use include piezoelectric films, films for electronic devices, films for capacitors, films for displays, films for touch panels, films for electrical insulation, films for magnetic recording, films for packaging, films for architecture, films for photography, and films for thermal transfer.

Relative Permittivity

Method for Determining Relative Permittivity

On both sides of a sample film, an aluminum electrode (thickness: about 300 Å) is prepared by a vacuum heating deposition method, and the capacitance (C) is measured with an LCR meter. From the capacitance, the electrode area (S), and the thickness (d) of the film, the relative permittivity is calculated according to the formula: $C=\varepsilon\times\varepsilon_0\times S/d$ ($\varepsilon_0$ is the permittivity in a vacuum).

The lower limit of the relative permittivity of the fluorine-containing polymer film can be, for example, 3.0, 3.5, or 4.0. The upper limit of the relative permittivity can be, for example, 50, 45, 40, 35, 30, 25, or 20. The relative permittivity can be, for example, within the range of 3.0 to 50, 3.5 to 45, or 4.0 to 20.

Surface Roughness

Method for Determining Surface Roughness

The surface roughness (Ra) is measured pursuant to JIS B 0601-1994 with a VK-9710 color 3D laser microscope (Keyence Corporation) or its equivalent, and an MUL00201 microscope attached to the VK-9710 microscope (Nikon Corporation) or its equivalent. The surface roughness is measured at five non-arbitrarily selected points on a film, and the arithmetic mean of the five points is taken as the surface roughness.

The surface roughness of the fluorine-containing polymer film can be, for example, 350 nm or less, 300 nm or less, or 250 nm or less. The surface roughness of the fluorine-containing polymer film can be, for example, 5 nm or more, 10 nm or more, or 12 nm or more. The surface roughness can be, for example, within the range of 5 to 350 nm, 10 to 300 nm, or 12 to 250 nm.

The ratio of the surface roughness (nm) to the film thickness (µm) of the fluorine-containing polymer film can be, for example, 70 or less, 60 or less, or 50 or less. The ratio can be, for example, 0.001 or more, 0.002 or more, 0.003 or more, or 0.004 or more. The ratio can be, for example, within the range of 0.001 to 70, 0.003 to 60, or 0.004 to 50.

Residual Polarization Amount

Method for Determining Residual Polarization Amount

A sample film is obtained by patterning an aluminum electrode (flat electrode) by vacuum processing deposition in the center (5 mm×5 mm) of a film cut to 20 mm×20 mm, and then attaching two lead electrodes (3 mm×80 mm) made of aluminum foil reinforced with insulating tape to this flat electrode with conductive double-sided tape. The sample film, a function generator, a high-voltage amplifier, and an oscilloscope are incorporated into a Sawyer-Tower circuit, and a triangular wave is applied to the sample film (maximum: ±10 kV). The response of the sample film is measured with the oscilloscope to determine the residual polarization amount at an applied electric field of 80 MV/m.

The residual polarization amount of the fluorine-containing polymer film is, for example, 100 $mC/m^2$ or less, 90 $mC/m^2$ or less, 80 $mC/m^2$ or less, 70 $mC/m^2$ or less, 60 $mC/m^2$ or less, 50 $mC/m^2$ or less, 40 $mC/m^2$ or less, or 35 $mC/m^2$ or less. The residual polarization amount is, for example, 5 $mC/m^2$ or more, preferably 10 $mC/m^2$ or more, 15 $mC/m^2$ or more, 20 $mC/m^2$ or more, or 25 $mC/m^2$ or more.

The residual polarization amount may be, for example, within the range of 5 to 100 $mC/m^2$, 5 to 80 $mC/m^2$, 5 to 40 $mC/m^2$, or 5 to 35 $mC/m^2$.

Internal Haze Value

Method for Determining Internal Haze Value

In the present specification, the "internal haze value" (inner haze) is determined in a haze (turbidity) test according to ASTM D1003 with a haze meter (product name: NDH7000SP CU2II, Nippon Denshoku Industries Co., Ltd.) or its equivalent. In the test, water is placed in a glass cell, and a film is inserted into the glass cell, followed by measuring the haze value.

The lower limit of the internal haze value of the fluorine-containing polymer film can be, for example, 0.01%, 0.05%, 0.1%, or 1%. The lower limit of the internal haze value can be set to a higher value, such as 20%, 25%, 30%, 35%, 40%, 45%, 50%, or 55%.

The upper limit of the internal haze value can be, for example, 90%, 85%, 80%, 75%, 70%, 65%, or 60%. The upper limit of the internal haze value can be set to a lower value, such as 15%, 10%, 5%, 4.5%, 4%, 3.50, or 3%.

The internal haze value can be, for example, 15% or less (e.g., within the range of 0.01 to 15%), 10% or less (e.g., within the range of 0.01 to 10%), or 5% or less (e.g., within the range of 0.01 to 5%, 0.05 to 4.5%, or 0.1 to 4%), or 20% or more (e.g., within the range of 20 to 80%), or 30% or more (e.g., within the range of 30 to 80%, 40 to 80%, more than 50% and 80% or less, or 55 to 80%).

Ratio of Internal Haze Value (%) to Film Thickness (µm)

The ratio of the internal haze value (%) to the film thickness (µm) of the fluorine-containing polymer film can be, for example, 0.7 or more, 0.8 or more, 0.9 or more, 1 or more, more than 1, or 1.1 or more; and can also be 0.01 or more, 0.05 or more, 0.1 or more, or 0.2 or more.

The ratio of the internal haze value (%) to the film thickness (µm) can be, for example, 5 or less, 4.5 or less, 4 or less, 3.5 or less, 3 or less, 2.5 or less, 2 or less, 1.7 or less, or 1.5 or less; and can also be 1 or less, 0.9 or less, 0.8 or less, 0.7 or less, 0.6 or less, 0.5 or less, or 0.4 or less.

The ratio of the internal haze value (%) to the film thickness (µm) can be, for example, within the range of 1 to 4.5, 1 to 4, 1 to 3.5, 1 to 3, or 1 to 2.5; or within the range of 0.1 to 1.7 or 0.7 to 1.5; or within the range of 0.4 or less or 0.01 to 0.4.

Retardation

Method for Determining Retardation

In the present specification, the retardation is determined by cutting a film sample to a size of 2 cm×2 cm or larger and measuring retardation with a RETS-100 testing instrument for phase difference films or optical materials (trade name, Otsuka Electronics Co., Ltd.) or its equivalent. In the present specification, a value at 550 nm is used as the value of retardation.

The lower limit of the retardation of the fluorine-containing polymer film is not particularly limited, and can be, for example, 0.5 nm, 1 nm, 2 nm, 4 nm, 5 nm, or 10 nm.

The upper limit of the retardation can be, for example, 5000 nm, 4500 nm, 4000 nm, 3500 nm, 3000 nm, 2500 nm, 2000 nm, 1500 nm, 1000 nm, 500 nm, 400 nm, or 300 nm. The upper limit of the retardation can also be 200 nm, 150 nm, 100 nm, or 50 nm. An upper limit of the retardation set within these ranges allows the fluorine-containing polymer film to have excellent optical isotropy and to be suitably used in optical devices. When used as a sensor, the fluorine-containing polymer film can exhibit isotropic sensing characteristics.

The retardation is preferably within the range of 0.5 to 500 nm, more preferably 0.5 to 400 nm, and still more preferably 1 to 400 nm.

Ratio of Retardation (nm) to Film Thickness (µm)

The ratio of the retardation (nm) to the film thickness (µm) refers to a value calculated by dividing the retardation determined by the method above by the film thickness determined by the method above.

The lower limit of the ratio of the retardation (nm) to the film thickness (μm) of the fluorine-containing polymer film can be, for example, 0.02, 0.05, or 0.1.

The upper limit of the ratio of the retardation (nm) to the film thickness (μm) of the fluorine-containing polymer film can be, for example, 2.5, 2.0, or 1.5.

The ratio can be, for example, within the range of 0.02 to 2.5 or 0.05 to 2.0.

Crystallinity

Method for Determining Crystallinity

Crystallinity refers to a value expressed by 100×(the area of a crystalline peak)/(the sum of the area of the crystalline peak and the area of an amorphous halo peak) wherein in an X-ray diffraction pattern obtained by placing the film sample directly on a sample holder with an aperture, and performing X-ray diffraction measurement at a diffraction angle 2θ of 10 to 40°, a baseline is set as a straight line connecting a diffraction intensity at a diffraction angle 28 of 10° and a diffraction intensity at a diffraction angle 2θ of 25°, and the area surrounded by the baseline and a diffraction intensity curve is separated into two symmetric peaks by profile fitting; of these peaks, the one with a larger diffraction angle 2θ is recognized as the crystalline peak, and the one with a smaller diffraction angle 2e is recognized as the amorphous halo peak.

The lower limit of the crystallinity of the fluorine-containing polymer film can be, for example, 5%, 10%, 15%, 20%, 25%, 30%, 35%, 40%, 45%, 50%, 55%, 60%, 65%, or 70%.

The upper limit of the crystallinity of the fluorine-containing polymer film can be, for example, 90%, 85%, 80%, or 75%.

The crystallinity can be, for example, within the range of 50% or more, 50 to 90%, 55 to 90%, 60 to 90%, or 65 to 90%. Adjusting the crystallinity so as to fall within these ranges is preferable from the standpoint of achieving a low thermal shrinkage. It is also possible to achieve a high elongation at break despite the crystallinity within these ranges.

Elongation at Break

Method for Determining Elongation at Break

The elongation at break can be measured by cutting a film sample to a piece of 100 mm×20 mm, attaching the cut sample to an autograph manufactured by Shimadzu Corporation or its equivalent with air chucks (chuck pressure: 0.5 MPa), and performing measurement pursuant to ASTM-D-882 at a temperature of 23±2° C., 50 mm between chucks, and a tensile rate of 500 ram/min.

The elongation at break of the fluorine-containing polymer film can be, for example, 50% or more, or 100% or more, and preferably 400% or more, or 450% or more.

The elongation at break can be, for example, 800% or less, or 750% or less; or 400% or less, or 350% or less.

The elongation at break can be, for example, within the range of 50 to 400%, or 50 to 350%; or within the range of 400 to 800%, or 450 to 750%.

Film Thickness

Method for Determining Film Thickness

In the present specification, the thickness of the film is measured with a photoelectric digital length measurement system (Digimicro MH-15M, Nikon) or its equivalent at 10 points every 1-cm square across the entirety of the film in the planar direction, and the average value is determined to be the thickness of the film.

The lower limit of the film thickness of the fluorine-containing polymer film can be, for example, 5 μm, 9 μm, or 10 μm.

The upper limit of the film thickness of the fluorine-containing polymer film can be, for example, 3000 μm, 2500 μm, 2000 μm, 1500 μm, 1000 μm, 800 μm, 500 μm, 200 μm, 100 μm, or 60 μm.

The film thickness can be, for example, within the range of 5 to 3000 μm, 5 to 2500 μm, 5 to 2000 μm, 5 to 1500 μm, 5 to 1000 μm, 5 to 800 μm, 5 to 500 μm, 5 to 200 μm, 5 to 100 μm, or 5 to 60 μm. The preferable film thickness can vary according to the intended use of the piezoelectric film.

Coefficient of Variation of Film Thickness

Method for Determining Coefficient of Variation of Film Thickness

In the present specification, the film is measured at 10 points every 1-cm square across the entirety of the film in the planar direction, and the coefficient of variation of the measured values is determined to be the coefficient of variation of the thickness.

The coefficient of variation of thickness of the fluorine-containing polymer film is preferably 10% or less, and still more preferably 5% or less.

Area

The area of the fluorine-containing polymer film is preferably 9 $cm^2$ or more from the standpoint of industrial productivity. This range of the area typically corresponds to the range of the area of the film produced by the roll-to-roll method. The lower limit of the area is preferably 10 $cm^2$, 50 $cm^2$, 100 $cm^2$, 200 $cm^2$, 300 $cm^2$, 320 $cm^2$, 400 $cm^2$, 500 $cm^2$, 600 $cm^2$, 700 $cm^2$, 800 $cm^2$, 900 $cm^2$, 1000 $cm^2$, 1100 $cm^2$, 1200 $cm^2$, 1300 $cm^2$, 1400 $cm^2$, 1500 $cm^2$, or 1600 $cm^2$. The upper limit of the area can be, for example, 4000 $m^2$, 3500 $m^2$, 3000 $m^2$, 2500 $m^2$, 2000 $m^2$, 1500 $m^2$, 1000 $m^2$, or 500 $m^2$.

The area can be, for example, within the range of 10 $cm^2$ to 4000 $m^2$, 100 $cm^2$ to 2000 $m^2$, or 600 $cm^2$ to 500 $m^2$.

Piezoelectric Constant $d_{33}$

Method for Determining Piezoelectric Constant $d_{33}$

The piezoelectric constant $d_{33}$ is measured with a PM300 piezometer system (Piezotest) or its equivalent to which a pin with a 1.5-mm-diameter tip is attached as a sample-fixing jig. The piezoelectric constant is measured at 10 non-arbitrarily selected points on the film, and the arithmetic mean value thereof is taken as the piezoelectric constant $d_{33}$. Selecting 10 non-arbitrary points on the film can be performed, for example, by selecting 10 points at 50-mm intervals on a straight line. The term "arbitrary" means that the coefficient of variation, described later, is intended to be small.

The actual measured value of the piezoelectric constant $d_{33}$ is positive or negative depending on the front or back of the film to be measured. In the present specification, the absolute value is described as the value of the piezoelectric constant $d_{33}$.

The lower limit of the piezoelectric constant $d_{33}$ of the fluorine-containing polymer film may be, for example, 0.5 pC/N, 1 pC/N, 3 pC/N, 5 pC/N, 7 pC/N, 10 pC/N, 15 pC/N, 17 pC/N, 18 pC/N, or 19 pC/N.

The upper limit of the piezoelectric constant $d_{33}$ may be, for example, 35 pC/N, 30 pC/N, 28 pC/N, 26 pC/N, or 20 pC/N.

The piezoelectric constant $d_{33}$ may be, for example, within the range of 0.5 to 35 pC/N, 1 to 35 pC/N, 3 to 35 pC/N, 5 to 35 pC/N, 10 to 35 pC/N, 15 to 35 pC/N, 17 to 35 pC/N, 18 to 35 pC/N, or 19 to 35 pC/N.

Coefficient of Variation of Piezoelectric Constant $d_{33}$

The coefficient of variation of the piezoelectric constant $d_{33}$ of the fluorine-containing polymer film is the ratio of the standard deviation of the piezoelectric constant $d_{33}$ to the arithmetic mean.

The lower limit of the coefficient of variation can be, for example, 0.0001, preferably 0.001, more preferably 0.01, and even more preferably 0.02, from the standpoint of production costs.

The upper limit of the coefficient of variation can be, for example, 2.0, preferably 1.0, more preferably 0.6, even more preferably 0.4, still even more preferably 0.3, and particularly preferably 0.15, from the standpoint of in-plane uniformity.

The coefficient of variation can be, for example, within the range of 0.01 to 1.0, 0.01 to 0.6, 0.01 to 0.5, 0.01 to 0.4, or 0.01 to 0.3.

In an embodiment, the fluorine-containing polymer film preferably has the thermal shrinkage and the relative permittivity; the fluorine-containing polymer film preferably further has at least one type of physical property selected from the group consisting of the surface roughness, the residual polarization amount, the internal haze value, the ratio of the internal haze value (%) to the film thickness (μm), the retardation, the ratio of the retardation (nm) to the film thickness (μm), the crystallinity, the elongation at break, the film thickness, the coefficient of variation of film thickness, the area, the piezoelectric constant $d_{33}$, and the coefficient of variation of piezoelectric constant $d_{33}$ described above.

In another embodiment, the fluorine-containing polymer film preferably has the crystallinity and the elongation at break described above; the fluorine-containing polymer film preferably further has at least one type of physical property selected from the group consisting of the thermal shrinkage, the relative permittivity, the surface roughness, the residual polarization amount, the internal haze value, the ratio of the internal haze value (%) to the film thickness (μm), the retardation, the ratio of the retardation (nm) to the film thickness (μm), the film thickness, the coefficient of variation of film thickness, the area, the piezoelectric constant $d_{33}$, and the coefficient of variation of piezoelectric constant $d_{33}$ described above.

For example, the fluorine-containing polymer film preferably satisfies any of the following (a) to (s):

(a) the fluorine-containing polymer film has a thermal shrinkage of 0.4% or less, a relative permittivity of 3 to 50, and a surface roughness of 350 nm or less;

(b) the fluorine-containing polymer film has a thermal shrinkage of 0.4% or less, a relative permittivity of 3 to 50, and a residual polarization amount of 40 $mC/m^2$ or less;

(c) the fluorine-containing polymer film has a thermal shrinkage of 0.4% or less, a relative permittivity of 3 to 50, and an internal haze value of 30% or more;

(d) the fluorine-containing polymer film has a thermal shrinkage of 0.4% or less, a relative permittivity of 3 to 50, an internal haze value of 30% or more, and a ratio of the internal haze value (%) to the film thickness (μm) within the range of 1 to 4.5 (e.g., within the range of 1 to 4, 1 to 3.5, 1 to 3, or 1 to 2.5);

(e) the fluorine-containing polymer film has a thermal shrinkage of 0.4% or less, a relative permittivity of 3 to 50, and a ratio of the retardation (nm) to the film thickness (μm) within the range of 2.5 or less (e.g., within the range of 0.002 to 2.5);

(f) the fluorine-containing polymer film has a thermal shrinkage of 0.4% or less, a relative permittivity of 3 to 50, and a crystallinity of 50% or more;

(g) the fluorine-containing polymer film has a thermal shrinkage of 0.4% or less, a relative permittivity of 3 to 50, a surface roughness of 350 nm or less, and a crystallinity of 50% or more;

(h) the fluorine-containing polymer film has a thermal shrinkage of 0.4% or less, a relative permittivity of 3 to 50, a residual polarization amount of 40 $mC/m^2$ or less, and a crystallinity of 50% or more;

(i) the fluorine-containing polymer film has a thermal shrinkage of 0.4% or less, a relative permittivity of 3 to 50, and an elongation at break of 400% or less;

(j) the fluorine-containing polymer film has a crystallinity of 50% or more, an elongation at break of 400% or more, and a ratio of the retardation (nm) to the film thickness (μm) within the range of 2.5 or less (e.g., within the range of 0.002 to 2.5);

(k) the fluorine-containing polymer film has a crystallinity of 50% or more, an elongation at break of 400% or more, and a surface roughness of 350 nm or less;

(l) the fluorine-containing polymer film has a crystallinity of 50% or more, an elongation at break of 400% or more, and a residual polarization amount of 40 $mC/m^2$ or less;

(m) the fluorine-containing polymer film has a crystallinity of 50% or more, an elongation at break of 400% or more, and an internal haze value of 20% or more;

(n) the fluorine-containing polymer film has a crystallinity of 50% or more, an elongation at break of 400% or more, an internal haze value of 20% or more, and a ratio of the internal haze value (%) to the film thickness (μm) within the range of 0.1 to 1.7;

(o) the fluorine-containing polymer film has a crystallinity of 50% or more, an elongation at break of 400% or more, and an internal haze value of 15% or less;

(p) the fluorine-containing polymer film has a crystallinity of 50% or more, an elongation at break of 400% or more, an internal haze value of 15% or less, and a ratio of the internal haze value (%) to the film thickness (μm) within the range of 0.4 or less (e.g., within the range of 0.01 to 0.4);

(q) the fluorine-containing polymer film has a crystallinity of 50% or more, an elongation at break of 400% or more, and a relative permittivity of 3 to 50;

(r) the fluorine-containing polymer film has a crystallinity of 50% or more, an elongation at break of 400% or more, a ratio of the retardation (nm) to the film thickness (μm) of 2.5 or less (e.g., within the range of 0.002 to 2.5), and a surface roughness of 350 nm or less; or (s) the fluorine-containing polymer film has a crystallinity of 50% or more, an elongation at break of 400% or more, a ratio of the retardation (nm) to the film thickness (μm) of 2.5 or less (e.g., within the range of 0.002 to 2.5), and a residual polarization amount of 40 $mC/m^2$ or less.

Piezoelectric Film

The piezoelectric film according to an embodiment of the present disclosure is formed from the fluorine-containing polymer film.

The piezoelectric film has various applications. Specific examples of applications include sensors (e.g. touch sensors, vibration sensors, biosensors, and tire sensors (sensors installed on the inner surface of tires)), actuators, touch panels, haptic devices (devices that have the ability to feed back tactile sensations to users), vibration power generators (e.g., power-generating vibration floors and power-generating vibration tires), speakers, and microphones.

Production Method

The fluorine-containing polymer film according to the present disclosure can be produced, for example, by a production method comprising at least one of the following steps A, B, or C, preferably a method comprising steps A to C:

step A: preparing a non-polarized fluorine-containing polymer film (e.g., an unstretched and non-polarized fluorine-containing polymer film) by casting;

step B: subjecting a non-polarized fluorine-containing polymer film (e.g., an unstretched and non-polarized fluorine-containing polymer film) to polarization treatment; and step C: subjecting a non-polarized fluorine-containing polymer film (e.g., an unstretched and non-polarized fluorine-containing polymer film) to heat treatment or subjecting a fluorine-containing polymer film to heat treatment at any time from step B.

Step A: Film Preparation Step

The method for producing a non-polarized fluorine-containing polymer film by a casting method comprises, for example:

(1) dissolving or dispersing the fluorine-containing polymer and the desired components described above (e.g., inorganic oxide particles and an affinity improver) in a solvent to prepare a liquid composition;

(2) applying (casting or coating) the liquid composition to a substrate; and (3) exposing the substrate, to which the liquid composition has been applied, to a predetermined temperature to form a film.

These steps are preferably performed by a roll-to-roll process, from the standpoint of industrial productivity.

The dissolution temperature in the preparation of the liquid composition is not limited, but is preferably room temperature to 80° C. from the standpoint of promoting dissolution and preventing film coloring.

Preferable examples of the solvent, from the standpoint of coloring prevention, include ketone solvents (e.g., methyl ethyl ketone (MEK), methyl isobutyl ketone (MIBK), acetone, diethyl ketone, dipropyl ketone, and cyclohexanone), ester solvents (e.g., ethyl acetate, methyl acetate, propyl acetate, butyl acetate, and ethyl lactate), ether solvents (e.g., tetrahydrofuran, methyltetrahydrofuran, and dioxane), and amide solvents (e.g., dimethylformamide (DMF) and dimethylacetamide). These solvents may be used singly or in a combination of two or more. The amount of the amide solvent contained in the solvent is preferably 50 mass % or less.

The liquid composition may be cast (or applied) onto a substrate according to a commonly used method, such as knife coating, cast coating, roll coating, gravure coating, blade coating, rod coating, air doctor coating, or slot die.

Of these, gravure coating or slot die is preferable from the standpoint of easy handling, little variation in thickness of the resulting film, and excellent productivity.

Examples of usable substrates include polyethylene terephthalate (PET) films.

The substrate to which the liquid composition has been applied may be exposed to a predetermined temperature according to a typical heat treatment (or heat drying) method for film formation. The heat treatment (or heat drying) is preferably performed, for example, by passing the substrate to which the liquid composition has been applied through a high-temperature furnace (or drying furnace) according to a roll-to-roll process.

The substrate to which the liquid composition has been applied is preferably exposed to a predetermined temperature in two or more stages (e.g., within the range of 2 to 4 stages, preferably 2 or 3 stages, and more preferably 2 stages).

The exposure preferably includes a stage of exposing the substrate to a first temperature and a stage of exposing the substrate that has been exposed to the first temperature to a second temperature lower than the first temperature.

The stage of exposure to the first temperature can be, for example, a stage of evaporating the solvent in the liquid composition. The first temperature (or drying temperature) may be, for example, 150° C. or higher, 155° C. or higher, 160° C. or higher, or 165° C. or higher, and 230° C. or lower, 220° C. or lower, 210° C. or lower, or 200° C. or lower. The time of exposure to the first temperature (or drying time) is preferably short, more preferably less than 1 hour, and even more preferably 0.8 hours or less (e.g., within the range of 0.3 to 0.8 hours).

The stage of exposure to the second temperature can be, for example, a stage of crystallization and a stage of crystal growth (increasing the degree of crystallinity). The second temperature is not limited as long as it is lower than the first temperature. For example, the second temperature may be, for example, 50° C. or lower (preferably room temperature or within the range of 20 to 50° C.), or 60° C. or higher and lower than 150° C., preferably within the range of 80 to 145° C., more preferably 100 to 140° C., and still more preferably 110 to 140° C. The time of exposure to the second temperature is, for example, 5 seconds or more, preferably a long period of time, for example, 1 hour or more, preferably 2 hours or more, more preferably 3 hours or more, even more preferably 4 hours or more, still even more preferably 5 hours or more, and particularly preferably 6 hours or more.

In particular, the exposure is preferably performed at a temperature within the range of 150 to 200° C. for a short period of time (e.g., less than 1 hour, and preferably 0.3 to 0.8 hours), and then at a temperature within the range of 110° C. or higher and lower than 150° C. for a long period of time (e.g., 5 hours or more, and preferably 6 hours or more). This treatment can form a fluorine-containing polymer film with a low thermal shrinkage, and a fluorine-containing polymer film with a high crystallinity and a high elongation at break.

It is also preferable to expose the substrate to a temperature within the range of 150 to 200° C. (e.g., exposure for less than 1 hour, preferably 0.3 to 0.8 hours), and then (preferably immediately after the previous exposure) expose the substrate to 50° C. or lower (e.g., room temperature, or within the range of 20 to 50° C.) (e.g., exposure for 5 seconds or more). This treatment can form a fluorine-containing polymer film that has a high crystallinity, a high elongation at break, and a low internal haze value.

The thickness of the non-polarized film prepared in step A may be set according to the piezoelectric film to be obtained.

Step B: Polarization Treatment Step

The non-polarized fluorine-containing polymer film (simply "non-polarized film" below) used in the polarization treatment step is preferably an unstretched film.

The polarization treatment can be performed by a commonly used method, preferably corona discharge treatment.

Although either negative corona or positive corona may be used for corona discharge, negative corona is preferably used because of the ease of polarization of non-polarized films.

The corona discharge treatment is not limited. The treatment can be performed, for example, by applying voltage to a non-polarized film using linear electrodes as described in JP2011-181748A; by applying voltage to a non-polarized film using needle-shaped electrodes; or by applying voltage to a non-polarized film using grid electrodes.

The conditions for the corona discharge treatment may be suitably set based on common knowledge in the art. If the conditions for corona discharge treatment are overly weak, the obtained film may have insufficient piezoelectricity. On the other hand, if the conditions for corona discharge treatment are overly strict, the obtained film may have point-like defects.

In order to suppress the in-plane variation of the piezoelectric constant $d_{33}$ of the obtained polarized film, it is desirable that the distance between each needle-shaped electrode and/or linear electrode and the film is constant; that is, it is desirable that there is no (or extremely small) in-plane variation in the distance between each electrode and the film (specifically, the difference between the longest distance and the shortest distance is preferably within 6 mm, more preferably within 4 mm, and even more preferably within 3 mm).

Additionally, for example, when voltage is continuously applied by a roll-to-roll process, it is desirable that the film is brought into close contact with the roll appropriately and uniformly by applying a constant tension to the film.

For example, when voltage is continuously applied using linear electrodes by a roll-to-roll process, the direct current electric field is within the range of, for example, −10 to −25 kV, although this varies depending on the distance between the linear electrodes and the non-polarized film, the film thickness, and the like. The rate of treatment is within the range of, for example, 10 to 1200 cm/min.

Alternatively, instead of corona discharge, the polarization treatment may be performed, for example, by applying voltage to the non-polarized film with the film sandwiched between plate electrodes. More specifically, when voltage is applied to the non-polarized film with the film sandwiched between plate electrodes, the following conditions, for example, may be applied: a direct current electric field within the range of 0 to 400 MV/m (preferably 50 to 400 MV/m), and a voltage application time within the range of 0.1 seconds to 60 minutes.

Step C: Heat Treatment Step

Step C is preferably optionally performed at any time from step B. More specifically, step C may be performed before step B, simultaneously with step B, or after step B. When step C is performed after step B, the heat treatment in step C can be performed on the polarized film obtained in step B or a part in which polarization has been completed in step B. More specifically, while the polarization treatment in step B is performed, the heat treatment in step C may also be performed on the part in which the polarization treatment has been completed.

The method of heat treatment is not limited, and may preferably include, for example, sandwiching the fluorine-containing polymer film (simply "the film" below) between two metal plates and heating the metal plates; heating a roll of the film in a constant-temperature chamber; heating a metal roll and bringing the film into contact with the heated metal roll in the production of the film by a roll-to-roll process; or passing the film through a heated oven by a roll-to-roll process. When step C is performed after step B, the polarized film alone may be heat-treated, or the film may be stacked on another type of film or metal foil to form a laminated film and the laminated film may be heat-treated. In particular, when the heat treatment is performed at high temperatures, the latter method is preferable because wrinkles are less likely to be formed in the polarized film.

The temperature for the heat treatment may vary depending on the type of polarized film to be heat-treated, and is preferably within the range of the melting point of the polarized film to be heat-treated −100° C. to the melting point of the polarized film to be heat-treated +40° C.

More specifically, the temperature for the heat treatment is preferably within the range of 80° C. or higher, more preferably 85° C. or higher, and even more preferably 90° C. or higher.

The temperature for the heat treatment is also preferably within the range of 170° C. or lower, more preferably 160° C. or lower, and even more preferably 140° C. or lower.

The time for the heat treatment is typically within the range of 10 seconds or more, preferably 0.5 minutes or more, more preferably 1 minute or more, and even more preferably 2 minutes or more.

The upper limit of the time for the heat treatment is not limited, and the time for the heat treatment is typically within the range of 60 minutes or less.

The conditions for the heat treatment are preferably such that the temperature for the heat treatment is within the range of 90° C. or higher, and the time for the heat treatment is within the range of 1 minute or more.

The heat treatment generally includes cooling the film to a predetermined temperature. The temperature is preferably within the range of 0° C. to 60° C., and may be room temperature. The cooling rate may be gradual or rapid, and rapid cooling is preferable from the standpoint of productivity. Rapid cooling can be performed, for example, by means such as air blowing. In the present specification, the heat treatment of the film described above is also referred to as "annealing treatment."

The film obtained in this manner has high piezoelectricity even after annealing treatment, and even after production of a piezoelectric material whose production process includes heat treatment.

Roll of Fluorine-Containing Polymer Film

The fluorine-containing polymer film can be preferably stored and shipped in the form of a roll.

The roll according to an embodiment of the present disclosure may consist of the film, may be a roll formed by laminating the film with a protective film or the like and rolling it, or may be a roll including a core of a paper tube or the like and the film wrapping the core.

The roll of the film preferably has a width within the range of 50 mm or more and a length within the range of 20 m or more.

The roll of the film can be prepared, for example, by winding the film using an unwinding roller and a winding roller.

From the standpoint of limiting the deflection of the film, it is preferable to set the unwinding roller and the winding roller parallel to each other, as is usually performed.

In order to improve the slipperiness of the film, the roller preferably used is a roller with good slipperiness, specifically a roller coated with a fluororesin, a plated roller, or a roller coated with a release agent.

Uneveness in the thickness of the film causes unevenness in the thickness of the roll, such as high edge (high edge; the end portion of the roll is thicker than the center of the roll in the axial direction; when the film thickness at both ends is smaller than that in the center, both ends sag compared to the center; or when the thickness changes in an inclined manner from one end to the other, the end with a smaller film thickness sags), which may form wrinkles. This may also cause deflection of the film (a curve formed when no tension other than the tension by gravity is applied) when the film is unwound.

In general, to prevent high edge of the roll, the edge of the film, which will be the edge of the roll, is slit with a slitter. When the thickness of the film is uneven over a wide range from the edge of the film, it is difficult to prevent high edge and deflection of the roll only by slitting the edge.

Further, in general, high edge, sagging, and deflection are more likely to occur in films that are wider (e.g., 100 mm or more) and longer (e.g., 50 m or more). However, the piezoelectric film described above has a highly uniform thickness. Thus, the piezoelectric film can be formed into a roll with reduced high edge, sagging, and deflection without any treatment on the film or simply by slitting the edge of the film (the edge of the roll) with a slitter, even when the film is wide (e.g., 100 mm or more) and long (e.g., 50 m or more).

The edges (film edges) removed by slitting can be collected and recycled as a raw material for the film.

The roll of the film has a highly uniform thickness. The ratio of the thickness of the roll at the thicker end to the thickness of the roll in center in the the axial direction is preferably within the range of 70 to 130%. This can limit the deflection of the film unwound from the roll of the film.

Further, it is preferable that at least the surface material of the roller for use in producing the film and the roll of the film is polytetrafluoroethylene (PTFE), chrome plating, or stainless steel (SUS).

Accordingly, wrinkles on the film can be decreased.

Piezoelectric Material

The piezoelectric material according to an embodiment of the present disclosure is a laminate, which contains the piezoelectric film and an electrode provided on at least one surface of the piezoelectric film.

Specific examples of the electrode include indium tin oxide (ITO) electrodes, tin oxide electrodes, aluminum electrodes, metal nanowires, metal nanoparticles (e.g., silver nanoparticles), and organic conductive resins.

The piezoelectric material may be a laminate containing the piezoelectric film, a positive electrode layer (or an upper electrode layer) provided on one surface of the piezoelectric film, and a negative electrode layer (or a lower electrode layer) provided on the other surface of the piezoelectric film.

The piezoelectric material may have an insulating layer on the surface of the electrode layer on which the piezoelectric film is not laminated. The piezoelectric material may also have a cover (e.g., an electromagnetic shielding layer) on the surface (or top surface) of the electrode layer on which the piezoelectric film is not laminated.

The method for producing the piezoelectric material comprises, for example:

preparing the piezoelectric film; and providing an electrode on at least one surface of the piezoelectric film.

In the step of providing an electrode, the method of forming the electrode generally includes heat treatment. Specific examples include a method of forming a film from an electrode material by a physical vapor deposition method (e.g., vacuum evaporation, ion plating, or sputtering) or by a chemical vapor deposition method (e.g., plasma CVD), and a method of applying an electrode material to a substrate.

The lower limit of the temperature for the heat treatment is, for example, 25° C., preferably 40° C., and more preferably 50° C.

The upper limit of the temperature for the heat treatment is the melting point of the polarized film to be heat-treated −3° C., for example, 220° C., preferably 180° C., more preferably 150° C., and even more preferably 130° C.

The temperature for the heat treatment can be within the range of, for example, 25 to 220° C., and preferably within the range of 40 to 130° C. The reduction of piezoelectricity can be significantly suppressed by performing heat treatment at such temperatures.

The time for the heat treatment is generally within the range of 10 seconds or more, preferably 1 minute or more, more preferably 10 minutes or more, and even more preferably 15 minutes or more.

The present disclosure also includes the following embodiments.

Item 1. A fluorine-containing polymer film having a thermal shrinkage of 0.4% or less after being heated at 90° C. for 1 hour, and having a relative permittivity of 3 to 50 at 25° C. at 1000 Hz.

Item 2. The fluorine-containing polymer film according to Item 1, having a surface roughness (Ra) of 350 nm or less.

Item 3. The fluorine-containing polymer film according to Item 1 or 2, having a residual polarization amount of 40 $mC/m^2$ or less.

Item 4. The fluorine-containing polymer film according to any one of Items 1 to 3, having an internal haze value of 30% or more.

Item 5. The fluorine-containing polymer film according to any one of Items 1 to 4, having a ratio of internal haze value (%) to film thickness (μm) within the range of 1 to 4.5.

Item 6. The fluorine-containing polymer film according to any one of Items 1 to 5, having a ratio of retardation (nm) to film thickness (μm) of 2.5 or less.

Item 7. The fluorine-containing polymer film according to any one of Items 1 to 6, having a crystallinity of 50% or more, the crystallinity being expressed by 100×(area of crystalline peak)/(sum of area of crystalline peak and area of amorphous halo peak)

wherein in an X-ray diffraction pattern obtained by placing a film sample directly on a sample holder with an aperture, and performing X-ray diffraction measurement at a diffraction angle 2θ of 10 to 40°, a baseline is set as a straight line connecting a diffraction intensity at a diffraction angle 2θ of 10° and a diffraction intensity at a diffraction angle 2θ of 25°, an area surrounded by the baseline and a diffraction intensity curve is separated into two symmetric peaks by profile fitting, and of these peaks, a peak with a larger diffraction angle 2θ is recognized as the crystalline peak, and a peak with a smaller diffraction angle 2θ is recognized as the amorphous halo peak.

Item 8. The fluorine-containing polymer film according to any one of Items 1 to 7, wherein the fluorine-containing polymer is a vinylidene fluoride-based polymer.

Item 9. The fluorine-containing polymer film according to Item 8, wherein the vinylidene fluoride-based polymer is a vinylidene fluoride-tetrafluoroethylene copolymer or a vinylidene fluoride-trifluoroethylene copolymer.

Item 10. A piezoelectric film comprising the fluorine-containing polymer film of any one of Items 1 to 9.

Item 11. A piezoelectric film comprising a fluorine-containing polymer film, wherein the fluorine-containing polymer film satisfies the following (1) and (2):

(1) the fluorine-containing polymer film has a crystallinity of 50% or more, the crystallinity being expressed by 100×(area of crystalline peak)/(sum of area of crystalline peak and area of amorphous halo peak) wherein in an X-ray diffraction pattern obtained by placing a film sample directly on a sample holder with an aperture, and performing X-ray diffraction measurement at a diffraction angle 2θ of 10 to 40°, a baseline is set as a straight line connecting a diffraction intensity at a diffraction angle 2θ of 10° and a diffraction intensity at a diffraction angle 2θ of 25°, an area surrounded by the baseline and a diffraction intensity curve is separated into two symmetric peaks by profile fitting, and of these peaks, a peak with a larger diffraction angle 28 is recognized as the crystalline peak, and a peak with a smaller diffraction angle 20 is recognized as the amorphous halo peak; and (2) the fluorine-containing polymer film has an elongation at break of 400% or more.

Item 12. The piezoelectric film according to Item 11, wherein the fluorine-containing polymer film has a ratio of retardation (nm) to film thickness (μm) of 2.5 or less.

Item 13. The piezoelectric film according to Item 11 or 12, wherein the fluorine-containing polymer film has a surface roughness (Ra) of 350 nm or less.

Item 14. The piezoelectric film according to any one of Items 11 to 13, wherein the fluorine-containing polymer film has a residual polarization amount of 40 $mC/m^2$ or less.

Item 15. The piezoelectric film according to any one of Items 11 to 14, wherein the fluorine-containing polymer film has an internal haze value of 20% or more.

Item 16. The piezoelectric film according to Item 15, wherein the fluorine-containing polymer film has a ratio of internal haze value (1) to film thickness (μm) within the range of 0.1 to 1.7.

Item 17. The piezoelectric film according to any one of Items 11 to 14, wherein the fluorine-containing polymer film has an internal haze value of 15% or less.

Item 18. The piezoelectric film according to Item 17, wherein the fluorine-containing polymer film has a ratio of internal haze value (%) to film thickness (μm) of 0.4 or less.

Item 19. The piezoelectric film according to any one of Items 11 to 18, wherein the fluorine-containing polymer has a relative permittivity of 3 to 50 at 25° C. at 1000 Hz.

Item 20. The piezoelectric film according to any one of Items 11 to 19, wherein the fluorine-containing polymer is a vinylidene fluoride-based polymer.

Item 21. The piezoelectric film according to any one of Items 11 to 20, wherein the fluorine-containing polymer is a vinylidene fluoride-tetrafluoroethylene copolymer or a vinylidene fluoride-trifluoroethylene copolymer.

Item 22. The piezoelectric film according to any one of Items 10 to 21, for use in one or more members selected from the group consisting of sensors, actuators, touch panels, haptic devices, vibration power generators, speakers, and microphones.

Item 23. A piezoelectric material that is a laminate, the piezoelectric material comprising:

the piezoelectric film of any one of Items 10 to 21, and an electrode provided on at least one surface of the piezoelectric film.

The present disclosure also includes the following embodiments.

A method for producing a fluorine-containing polymer film, comprising:

(1) preparing a liquid composition containing a fluorine-containing polymer and a solvent;

(2) applying the liquid composition to a substrate; and (3) exposing the substrate, to which the liquid composition has been applied, to a predetermined temperature to form a film.

The above production method, wherein step (3) is a step of exposing the substrate to a temperature of 150 to 200° C. for less than 1 hour, and then to a temperature of 60° C. or higher and lower than 150° C. for 5 hours or more.

The above production method, wherein step (3) is a step of exposing the substrate to a temperature of 150 to 200° C. for less than 1 hour, and then to a temperature of 50° C. or lower.

EXAMPLES

One embodiment of the present disclosure is described in more detail below with reference to Examples; however, the present disclosure is not limited to the Examples.

The following electrodes were used in the Examples described later.

Electrodes Used (1) A needle-shaped electrode rod formed such that electrode needles (needle-shaped electrodes) (R=0.06 mm; produced by Morita Seishinsho Co., Ltd.) are arranged in a row at 10-mm intervals on the center line of a 20-mm-wide (10-mm-thick, 500-mm-long) brass rod.

(2) A needle-shaped electrode rod formed such that electrode needles (R=0.06 mm; produced by Morita Seishinsho Co., Ltd.) are arranged in a row at 15-nm intervals as in (1).

(3) A gold-plated linear tungsten electrode with a diameter of 0.1 mm (length: 500 mm)

The thermal shrinkage, relative permittivity, surface roughness, residual polarization amount, internal haze value, retardation, crystallinity, elongation at break, film thickness, and piezoelectric constant $d_{33}$ of the piezoelectric films described later were measured according to the following methods.

Thermal Shrinkage

A film was cut to a size of A4, and the vertices of a 10-cm square in the cut film with the MD and TD directions as the vertical and horizontal directions were marked with an inkjet printer. Then, the length of a side before and after heating was measured with an optical microscope (compact microscope: Olympus STM6). Heating was performed by placing the film in a heating oven (ETTAS ONW-3005 constant-temperature dryer) at 90° C. for 1 hour. The thermal shrinkage was determined according to the following formula:

Thermal shrinkage (%)=((the length of a side before heating)−(the length of the side after heating))/(the length of the side before heating)×100

Relative Permittivity

On both sides of a sample film, an aluminum electrode (thickness: about 300 Å) was prepared by a vacuum heating deposition method, and the capacitance (C) was measured with an LCR meter. From the capacitance, the electrode area (S), and the film thickness (d), the relative permittivity was calculated according to the formula: $C=\varepsilon\times\varepsilon_0\times\varepsilon S/d$ ($\varepsilon_0$ is the permittivity in a vacuum).

Surface Roughness

The surface roughness (Ra) was measured pursuant to JIS B 0601-1994 with a VK-9710 color 3D laser microscope (Keyence Corporation), and an MUL00201 microscope attached to the VK-9710 microscope (Nikon Corporation). The surface roughness was measured at five non-arbitrarily selected points on a film, and the surface roughness was determined from the average value.

Residual Polarization Amount

An aluminum electrode (flat electrode) was patterned by vacuum processing deposition on the center (5 mm×5 mm) of a sample film cut to 20 mm×20 mm. Two lead electrodes (3 mm×80 mm) made of aluminum foil reinforced with insulating tape were attached to the flat electrode with conductive double-sided tape. The sample film, a function generator, a high-voltage amplifier, and an oscilloscope were incorporated into a Sawyer-Tower circuit, and a triangular wave was applied to the sample film (maximum: ±10 kV). The response of the sample film was measured using the oscilloscope to determine the residual polarization amount at an applied electric field of 80 MV/m.

Internal Haze Value

Water was placed in a quartz cell, and the film was inserted into the quartz cell, followed by measuring the internal haze value according to ASTM D1003 with an NDH7000SP CU2II haze meter (product name, Nippon Denshoku Industries Co., Ltd.).

Retardation

The retardation was determined by cutting a film sample to a size of 2 cm×2 cm or larger and measuring retardation with a RETS-100 testing instrument for phase difference films or optical materials (trade name, Otsuka Electronics Co., Ltd.). A value at 550 nm was used as the value of retardation.

Crystallinity

A film sample was placed directly on a sample holder with an aperture, and X-ray diffraction measurement was performed at a diffraction angle 2θ of 10 to 40°. In the obtained X-ray diffraction pattern, a baseline was set as a straight line connecting a diffraction intensity at a diffraction angle 2θ of 10° and a diffraction intensity at a diffraction angle 2θ of 25°. The area surrounded by the baseline and a diffraction intensity curve was separated into two symmetric peaks by profile fitting. Of these peaks, the one with a larger diffraction angle 2θ was recognized as a crystalline peak, and the one with a smaller diffraction angle 2θ was recognized as an amorphous halo peak.

The crystallinity was calculated according to the formula: 100×(the area of the crystalline peak)/(the sum of the area of the crystalline peak and the area of the amorphous halo peak).

Elongation at Break

The elongation at break was measured by cutting a film sample to a piece of 100 mm×20 mm, attaching the cut sample (N=5) to an autograph manufactured by Shimadzu Corporation with air chucks (chuck pressure: 0.5 MPa), and performing measurement pursuant to ASTM-D-882 at a temperature of 23±2° C., 50 mm between chucks, and a tensile rate of 500 mm/min.

Film Thickness

The thickness of the film was measured with a photoelectric digital length measurement system (Digimicro MH-15M, Nikon) at 10 points every 1-cm square across the entirety of the film in the planar direction, and the thickness of the film was determined from the average value.

Piezoelectric Constant $d_{33}$

The piezoelectric constant $d_3$ was measured using a piezometer system (PM300, Piezotest). In this measurement, a sample was clipped at 1 N, and the charge generated by applying a force of 0.25 N at 110 Hz was read.

(1) Production of Piezoelectric Films

Piezoelectric Film 1

A piezoelectric film 1 was prepared by a casting method. Specifically, the piezoelectric film 1 was obtained by spreading a 24 wt % solution of a vinylidene fluoride-tetrafluoroethylene copolymer (molar ratio 80:20) in methyl ethyl ketone on a PET base film, evaporating the solvent by treatment at 190° C. for 0.5 hours, then lowering the temperature to 120° C. and maintaining it for 5 hours, and then cooling it to room temperature, followed by polarization treatment described below.

Piezoelectric Film 2

A piezoelectric film 2 was prepared by a casting method. Specifically, the piezoelectric film 2 was obtained by spreading a 24 wt % solution of a vinylidene fluoride-tetrafluoroethylene copolymer (molar ratio 80:20) in methyl ethyl ketone on a PET base film, evaporating the solvent by treatment at 190° C. for 0.5 hours, then lowering the temperature to 120° C. and maintaining it for 6 hours, and then cooling it to room temperature, followed by polarization treatment described below.

Piezoelectric Film 3

A piezoelectric film 3 was prepared by a casting method. Specifically, the piezoelectric film 3 was obtained by spreading a 10 wt % solution of a vinylidene fluoride-tetrafluoroethylene copolymer (molar ratio 70:30) in methyl ethyl ketone on a PET base film, evaporating the solvent by treatment at 190° C. for 0.5 hours, then lowering the temperature to 125° C. and maintaining it for 5 hours, and then cooling it to room temperature, followed by polarization treatment described below.

Piezoelectric Film 4

A piezoelectric film 4 was prepared by a casting method. Specifically, the piezoelectric film 4 was obtained by spreading a 20 wt % solution of a vinylidene fluoride-trifluoroethylene copolymer (molar ratio 79:21) in methyl ethyl ketone on a PET base film, evaporating the solvent by treatment at 190° C. for 0.5 hours, then lowering the temperature to 130° C. and maintaining it for 5 hours, and then cooling it to room temperature, followed by polarization treatment described below.

Piezoelectric Film 5

A piezoelectric film 5 was prepared by a casting method. Specifically, the piezoelectric film 5 was obtained by spreading a 20 wt % solution of a vinylidene fluoride-trifluoroethylene copolymer (molar ratio 79:21) in methyl ethyl ketone on a PET base film, evaporating the solvent by treatment at 180° C. for 0.5 hours, and then immediately maintaining it at room temperature, followed by polarization treatment described below.

Polarization Treatment

In an ISO class 7 clean room (humidity: 60%), as outlined in FIG. 1, a vinylidene fluoride/tetrafluoroethylene copolymer film 2 (simply referred to as "film 2" below) having a width of 550 mm, a length of 200 m, and a film thickness (20 to 40 μm) shown in Table 1 was mounted on a SUS ground electrode, which was a grounded roller 1 (diameter: 200 mm, width: 800 rum), so that the film moved along the roller 1 at a wrap angle of 200°. Needle-shaped electrodes (first electrode E1) were placed so that the line of the needle-shaped electrodes was perpendicular to the surface of the roller 1 (i.e., in the moving radius direction of the roller 1) and so that the tip of the needle-shaped electrodes (first electrode E1) was placed at a distance of 10 mm above the film 2. The first electrode E1 was connected to a first high-voltage power supply P1. Further, a single gold-plated linear tungsten electrode (length: 550 mm) with a diameter of 0.1 mm was placed as a second electrode E2 at a distance of 100 mm and at a distance of 150 mm, as the length of the film 2, from the needle-shaped electrodes (first electrode E1), and at a distance of 20 mm above the film 2. Each of the second electrodes E2 was connected to a second high-voltage power supply V2.

After application of a voltage of −10 kV to the needle-shaped electrodes (first electrode E1) and a voltage of −10 to −16 kV to the linear electrodes (second electrodes E2), the film 2 was moved in the direction of the arrows in FIG. 1 at a rate of 96 cm/min, and allowed to pass under the tip of the needle-shaped electrodes (first electrode) and the corona discharge generated by the subsequent linear electrodes (second electrodes). Further, the film 2 was brought into contact with a grounded metal roll 3 (diameter: 70 mm) to remove the electricity from the film 2. Then, both ends of the film 2 were removed by 0.5 cm in width using a slitter, and the obtained polarized film was wound around a cylindrical core having a diameter of 6 inches with a PET film sandwiched between them. The polarized film was thus produced.

The distance between the needle-shaped electrodes (first electrode E1) and the film 2, and the distance between each linear electrode (second electrode E2) and the film 2 were adjusted so that they were all constant (the difference between the longest distance and the shortest distance between each electrode and film was 0 mm).

(2) Evaluation of Piezoelectric Film

Table 1 below shows the evaluation results of the piezoelectric films prepared in the Examples.

TABLE 1

| | Piezoelectric film 1 | Piezoelectric film 2 | Piezoelectric film 3 | Piezoelectric film 4 | Piezoelectric film 5 |
|---|---|---|---|---|---|
| Thermal Shrinkage MD (%) | −0.04 | 0.02 | −0.19 | 0.02 | 0.11 |
| Thermal Shrinkage TD (%) | 0.17 | −0.01 | −0.01 | 0.07 | 0.09 |
| Thermal Shrinkage (Maximum Shrinkage Direction) | 0.17 | 0.02 | −0.01 | 0.07 | 0.11 |
| Relative Permittivity (25° C., 1000 Hz) | 7.8 | 7.0 | 11.9 | 10.9 | 11.0 |
| Surface Roughness (nm) | 84 | 292 | 35 | 132 | 96 |
| Residual Polarization Amount ($mC/m^2$) | 32.7 | 46.1 | 45.9 | 68.3 | 53.2 |
| Internal Haze Value (%) | 54 | 74 | 10 | 78 | 24 |
| Retardation (nm) | 32 | — | 10 | — | 3 |
| Crystallinity (%) | 55 | 67 | 65 | 61 | 60 |
| Elongation at Break (%) | 542 | 113 | 425 | 66 | 405 |
| Area ($cm^2$) | 930 | 930 | 630 | 630 | 630 |
| Film Thickness (μm) | 40 | 41 | 30 | 24 | 33 |
| Piezoelectric Constant $d_{33}$ (pC/N) | 15.7 | 20.1 | 20.0 | 23.3 | 19.8 |

The invention claimed is:

1. A fluorine-containing polymer film having a thermal shrinkage of 0.4% or less after being heated at 90° C. for 1 hour, having a relative permittivity of 3 to 50 at 25° C. at 1000 Hz, and having a ratio of retardation (nm) to film thickness (μm) of 2.5 or less.

2. The fluorine-containing polymer film according to claim 1, having a surface roughness (Ra) of 350 nm or less.

3. The fluorine-containing polymer film according to claim 1, having a residual polarization amount of 40 $mC/m^2$ or less.

4. The fluorine-containing polymer film according to claim 1, having an internal haze value of 30% or more.

5. The fluorine-containing polymer film according to claim 1, having a ratio of internal haze value (%) to film thickness (μm) within the range of 1 to 4.5.

6. The fluorine-containing polymer film according to claim 1, having a crystallinity of 50% or more, the crystallinity being expressed by 100×(area of crystalline peak)/(sum of area of crystalline peak and area of amorphous halo peak)

wherein in an X-ray diffraction pattern obtained by placing a film sample directly on a sample holder with an aperture, and performing X-ray diffraction measurement at a diffraction angle 2θ of 10 to 40°, a baseline is set as a straight line connecting a diffraction intensity at a diffraction angle 2θ of 10° and a diffraction intensity at a diffraction angle 2θ of 25°, an area surrounded by the baseline and a diffraction intensity curve is separated into two symmetric peaks by profile fitting, and of these peaks, a peak with a larger diffraction angle 2θ is recognized as the crystalline peak, and a peak with a smaller diffraction angle 2θ is recognized as the amorphous halo peak.

7. The fluorine-containing polymer film according to claim 1, wherein the fluorine-containing polymer is a vinylidene fluoride-based polymer.

8. The fluorine-containing polymer film according to claim 7, wherein the vinylidene fluoride-based polymer is a vinylidene fluoride-tetrafluoroethylene copolymer or a vinylidene fluoride-trifluoroethylene copolymer.

9. A piezoelectric film comprising the fluorine-containing polymer film of claim 1.

* * * * *